(12) United States Patent
Nanjo (10) Patent No.: US 6,909,189 B2
(45) Date of Patent: Jun. 21, 2005

(54) SEMICONDUCTOR DEVICE WITH DUMMY STRUCTURE

(75) Inventor: Ryota Nanjo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 54 days.

(21) Appl. No.: 10/696,038

(22) Filed: Oct. 30, 2003

(65) Prior Publication Data

US 2004/0089950 A1 May 13, 2004

(30) Foreign Application Priority Data

Oct. 31, 2002 (JP) ........................................ 2002-317758

(51) Int. Cl.[7] .............................................. H01L 23/48
(52) U.S. Cl. ...................... 257/758; 257/206; 257/207; 257/210; 257/501; 257/510; 257/752; 257/774; 257/776
(58) Field of Search ................. 257/201–211, 506–510, 257/501, 513, 523, 734, 750, 752, 753, 758, 773–776, 784, 786

(56) References Cited

U.S. PATENT DOCUMENTS 6,225,697 B1 * 5/2001 Iguchi ......................... 257/758
6,396,123 B1 * 5/2002 Nagaoka ...................... 257/532

FOREIGN PATENT DOCUMENTS

JP 3247600 11/2001

* cited by examiner

Primary Examiner—Andy Huynh
(74) Attorney, Agent, or Firm—Westerman, Hattori, Daniels & Adrian, LLP

(57) ABSTRACT

A semiconductor device having: a semiconductor substrate with an isolation region defining a plurality of active regions; a gate electrode formed above each active region, constituting a semiconductor element; an interlevel insulator covering the gate electrode; local interconnects formed through the interlevel insulator and electrically connected to the semiconductor element; local interconnect dummies formed through the interlevel insulator and electrically separated from the local interconnects; and lower level dummies, each comprising either one of an active region dummy, a laminated dummy of an active region dummy and a gate electrode dummy formed thereon, and a gate electrode dummy formed on the isolation region, wherein each of the local interconnect dummies is not connected to two or more lower level dummies.

10 Claims, 9 Drawing Sheets

SEMICONDUCTOR DEVICE WITH DUMMY STRUCTURE

CROSS REFERENCE TO RELATED APPLICATION

This application is based on and claims priority of Japanese Patent Application No. 2002-317758 filed on Oct. 31, 2002, the entire contents of which are incorporated herein by reference.

BACKGROUND OF THE INVENTION

A) Field of the Invention

The present invention relates to a semiconductor device, and more particularly to a semiconductor device having a dummy structure which does not function as part of an electronic circuit. The dummy structure is made of an active region dummy, a gate electrode dummy, a local interconnect dummy or the like.

B) Description of the Related Art

Since the recent integration degree of semiconductor integrated circuit devices is high, shallow trench isolation (STI) excellent in planarization has been adopted as isolation techniques in place of local oxidation of silicon (LOCOS). Since the gate length is becoming shorter than ever, a high patterning precision is required to form a gate electrode. Local interconnects are often used for electrically connecting electronic elements such as MOS transistors and capacitors in a local area.

For example, a buffer silicon oxide film and a silicon nitride film are formed on a silicon substrate, and an opening is formed through the silicon nitride film and the buffer silicon oxide film, the opening having a shape corresponding to an isolation region which defines active regions. By using the silicon nitride film as a mask, the silicon substrate is etched to form an isolation trench.

An insulating layer such as a silicon oxide film is deposited to bury or embed the insulating layer in the isolation trench. An unnecessary insulating film deposited on the silicon nitride film is removed by chemical mechanical polishing (CMP). With the above processes, a silicon substrate can be obtained which has a trench isolation region and a flat surface.

The silicon nitride film used as the mask is removed and necessary ion implantation is performed. Thereafter, a gate oxide film and a polysilicon film are formed on the surface of the active region. The gate oxide film and polysilicon film are patterned to form an insulated gate electrode (and word line) through anisotropic etching using a photoresist pattern. The gate electrode having a short gate length can be formed through high precision patterning.

After ions are implanted into the regions on both sides of the gate electrode to form extension regions, an insulating film such as a silicon oxide film is deposited and anisotropic etching is performed to form side wall spacers. By using the gate electrode and side wall spacers as a mask, ion implantation is performed to form high impurity concentration or deep source/drain regions. Annealing is performed to activate implanted impurity ions.

If the resistances of the gate electrode and source/drain regions are to be reduced, metal capable of silicidation such as Co is deposited on the surface of the silicon substrate and a silicide layer is formed on the silicon surface through silicidation reaction.

Thereafter, an interlevel insulating film is deposited burying or embedding the gate electrode. An irregular surface due to the gate electrode and the like is planarized by CMP. Via holes for deriving electrodes and grooves for local interconnects are formed through the interlevel insulating film by anisotropic etching. A local interconnect groove has, for example, a constant width. A metal layer such as Ti, TiN and W is deposited to bury the metal layer in the via holes and local interconnect grooves. An unnecessary metal layer deposited on the surface of the interlevel insulating film is removed by CMP or the like. Thereafter, necessary upper level wirings and an interlevel insulating film or films are formed.

Gate electrodes and local interconnects on the surface of a silicon substrate have a high integration density and require a highest precision. High precision photolithography requires a flat surface of an underlying layer. If the surface is irregular, an image transfer precision of photolithography lowers. If the distribution of the areas for gate electrodes and local interconnects (including via holes) to be etched have a variation, etch rate changes with this variation.

If the distribution of areas of an isolation region has a large variation in an STI process, the central area of the silicon oxide film buried in a trench having a large width is polished faster than other areas, resulting in dishing. In an active region having a small width sandwiched between trench portions having a large width or in a region where active regions having a small width are dense, CMP does not stop at the silicon nitride film and the active regions are polished, resulting in erosion. If the flatness of the substrate surface is lost because of such phenomena, a later lithography process for an upper layer is adversely affected.

If the distribution of via conductors and local interconnects has a variation, similar phenomena occur during CMP which is performed after a conductive layer is buried in via holes and local interconnect grooves formed through the interlevel insulating film.

In order to guarantee the surface flatness, it is desired to distribute active region dummies in addition to active regions defined by an isolation region. Similarly, it is desired to distribute local interconnect dummies when via holes and local interconnect grooves are disposed. When gate electrodes are formed, it is desired to form gate electrode dummies in order to make uniform the distribution of gate electrodes. Such dummy regions are often designed by automatic calculations. However, forming dummy regions may pose other problems.

Figure 7A:
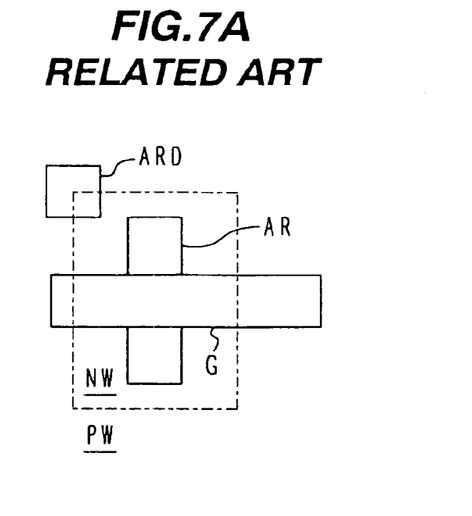
FIGS. 7A to 7E are plan views illustrating related art.
Figure 7B:
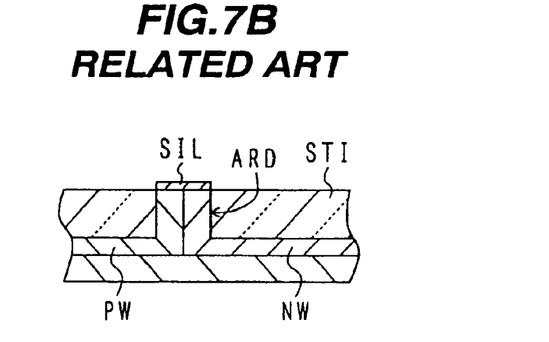

FIGS. 7A and 7B illustrate a problem posed by forming an active region dummy. An active region AR has an exposed silicon surface defied by an isolation region. An insulated gate electrode G is formed traversing the active region AR. An n-type well NW is formed under the active region. A p-type well PW surrounds the n-type well NW. In this layout, a problem occurs if an active region dummy ARD is formed lying across the boundary between the n-type well NW and p-type well PW, as shown in FIG. 7A.

As shown in FIG. 7B, as the active region dummy ARD is formed lying across the boundary between the n-type well NW and p-type well PW and a silicide layer SIL is formed on the surface of the active region dummy, the n-type well NW and p-type well PW are electrically short-circuited by the silicide layer SIL.

Figure 7C:
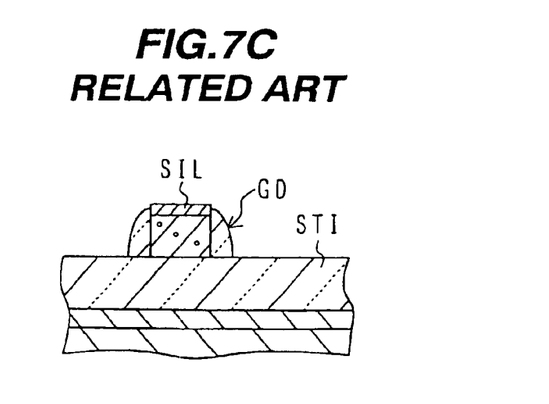

FIG. 7C shows the structure of a gate electrode dummy GD formed on the surface of an isolation region STI. A similar cross sectional structure is obtained if a gate electrode extends on an isolation region. A polysilicon layer pattern is formed and a silicide layer SIL is formed on the surface of the polysilicon layer pattern.

After the active region dummy ARD and gate electrode dummy GD are formed, a local interconnect dummy LID is formed through an interlevel insulating film formed over the active region dummy ARD and gate electrode dummy GD. Since the active region dummy ARD and gate electrode dummy GD are positioned under the local interconnect dummy, these dummies ARD and GD are collectively called a lower level dummy LD.

Figure 7D:
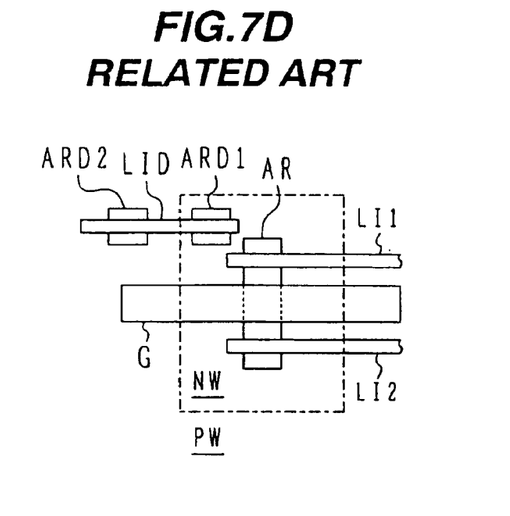

FIG. 7D illustrates a problem posed by the active region dummy ARD and local interconnect dummy LID. In the structure similar to that shown in FIG. 7A, an active region dummy ARD1 is formed in the n-type well NW, and an active region dummy ARD2 is formed in the p-type well PW. The local interconnect dummy LID is formed at the same time when local interconnects LI1 and LI2 of an actual device are formed.

Since the local interconnect dummy LID electrically connects the active regions ARD1 and ARD2, the n-type well NW and p-type well PW are electrically short-circuited by the local interconnect dummy LID. This problem occurs when the active region dummy and local interconnect dummy are designed independently.

Figure 7E:
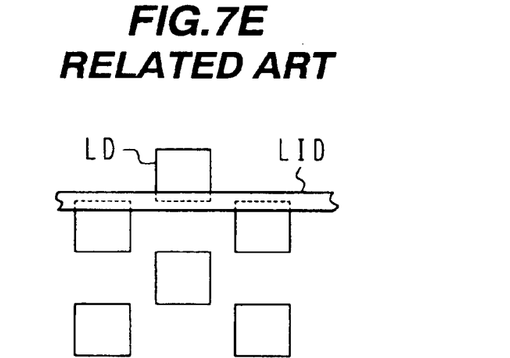

FIG. 7E illustratively shows another problem posed by forming dummies. A local interconnect dummy LID is disposed above lower level dummies LD and electrically connected to the lower level dummies LD. If a wiring layer is formed above the local interconnect dummy LID, parasitic capacitance is formed between the wiring layer and the local interconnect dummy LID. The parasitic capacitance is large because the local interconnect dummy LID is connected to a plurality of lower level dummies. If the distribution of parasitic capacitances is irregular, the electric characteristics of wiring layers have a variation.

There is a proposal that dummy patterns should be disposed obliquely relative to a reference axis of semiconductor elements in a semiconductor device in order to make uniform parasitic capacitances (Japanese Patent No. 3247600).

SUMMARY OF THE INVENTION

An object of this invention is to provide a semiconductor device capable of ensuring surface flatness by using dummies and suppressing the influence of dummies upon the device.

Another object of the invention is to provide a semiconductor device capable of making uniform parasitic capacitances of an upper level wiring layer even if dummies are formed, and capable of preventing electric shortage between wells even if a silicide process is incorporated.

According to one aspect of the present invention, there is provided a semiconductor device comprising: a semiconductor substrate; an isolation region formed in a surface layer of said semiconductor substrate and defining a plurality of active regions; at least one gate electrode formed above a substrate surface in each active region, constituting a semiconductor element in the active region; an interlevel insulating film formed on said semiconductor substrate, covering said gate electrode; a plurality of local interconnects formed through said interlevel insulating film and electrically connected to a region of the semiconductor element; a plurality of local interconnect dummies formed through said interlevel insulating film and electrically separated from said local interconnect; and a plurality of lower level dummies each including one of an active region dummy formed through said isolation region, a laminated dummy of an active region dummy formed through said isolation region and a gate electrode dummy formed on said active region dummy and a gate electrode dummy formed above said isolation region, wherein each of said local interconnect dummies is disposed so that said local interconnect dummy is not connected to two lower level dummies.

Even if dummy structures are formed, electric malfunction such as electric shortage between wells can be prevented. Parasitic capacitances of a wiring layer formed above dummy structures can be made uniform.

DESCRIPTION OF THE PREFERRED EMBODIMENTS

Embodiments of the invention will be described with reference to the accompanying drawings.

Figure 1:
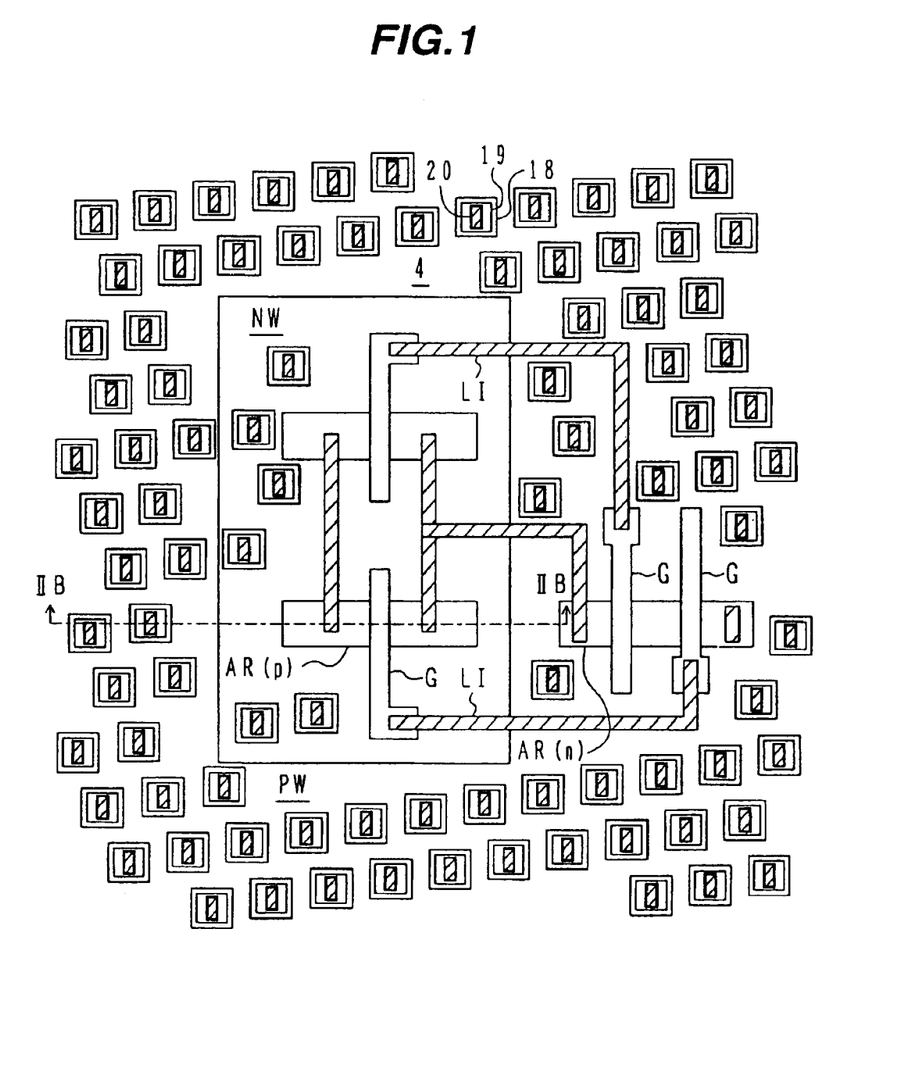
FIG. 1 shows a plan layout of a semiconductor device according to an embodiment of the invention.

FIG. 1 shows a plan layout of a semiconductor device according to an embodiment of the invention. Active regions AR(n) and AR(p) are defined by an isolation region 4 formed by STI. The active region AR(p) for a p-channel MOS transistor is disposed in an n-type well NW. A p-type well PW is disposed surrounding the n-type well NW. The active region AR(n) for an n-channel MOS transistor is disposed in the p-type well PW. Active region dummies 18 are disposed in the n-type well NW and p-type well PW in such a manner that they will not lie across the boundary between the n-type well NW and p-type well PW.

Gate electrodes G are formed traversing the active region AR(n). A gate electrode dummy 19 is formed on each active region dummy 18 by using the same layer as that of the gate electrode G. Local interconnects LI are formed interconnecting desired regions of semiconductor elements formed in the active regions.

Local interconnect dummies 20 are also formed above active region dummies 18. The local interconnect dummy 20 is formed on the underlying gate electrode dummy 19, and the gate electrode dummy 19 is formed inside the underlying active region dummy 18.

The width of the gate electrode dummy is set to the optimum width selected from various gate electrode widths. The widths of local interconnects are generally set to the same width. The widths of the local interconnect dummies may be the same width as that of the local interconnect or wider. It is preferable that the width of the local interconnect dummy is set in the range from the same width as that of the local interconnect to twice the width of the local interconnect. Two or more different widths may be adopted.

With the layout described above, the local interconnect dummy 20 will not be connected to a plurality of active region dummies 18. Since the active region dummy 18 is formed not lying across the boundary between wells, the n-type well NW and p-type well PW will not be electrically shortened. Since the local interconnect dummy 20 is not connected to a plurality of gate electrode dummies 19 or active region dummies 18, it is possible to prevent a local increase in parasitic capacitance.

Figure 2A:
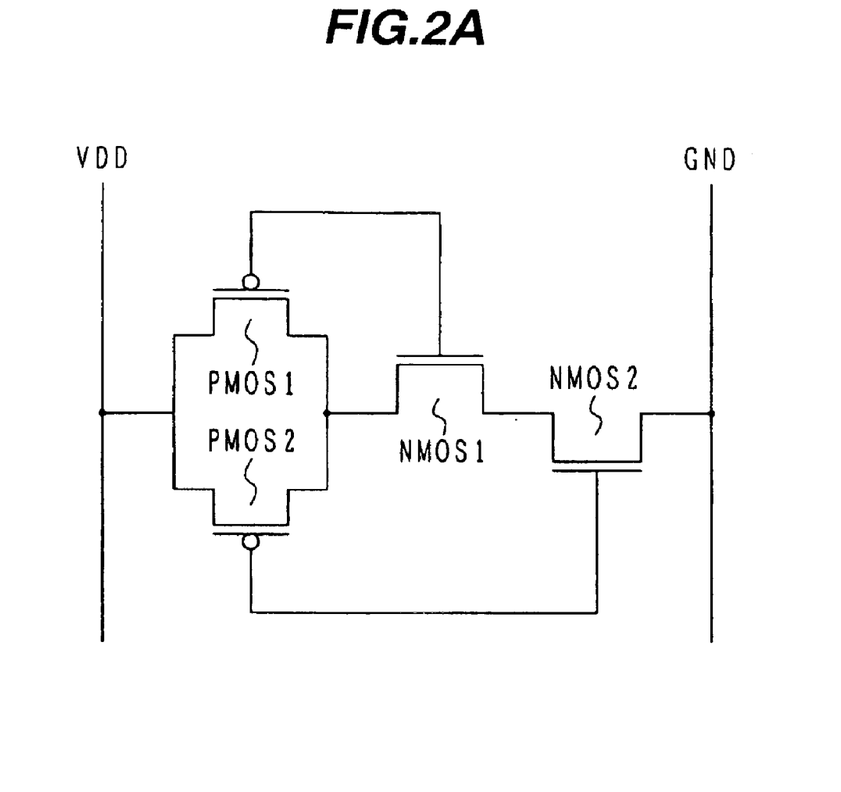
FIGS. 2A and 2B are an equivalent circuit diagram and a partial cross sectional view of the semiconductor device of the embodiment shown in FIG. 1.

FIG. 2A is an equivalent circuit diagram of the structure shown in FIG. 1. As shown, p-type MOS transistors PMOS1 and PMOS2 are disposed in parallel and source/drain regions are connected in common. This parallel connection is connected to a serial connection of n-channel MOS transistors NMOS1 and NMOS2. The gate electrodes of PMOS1 and NMOS1 are connected in common and the gate electrodes of PMOS2 and NMOS2 are also connected in common. This parallel/serial connection is connected between power source lines VDD and GND.

Figure 2B:
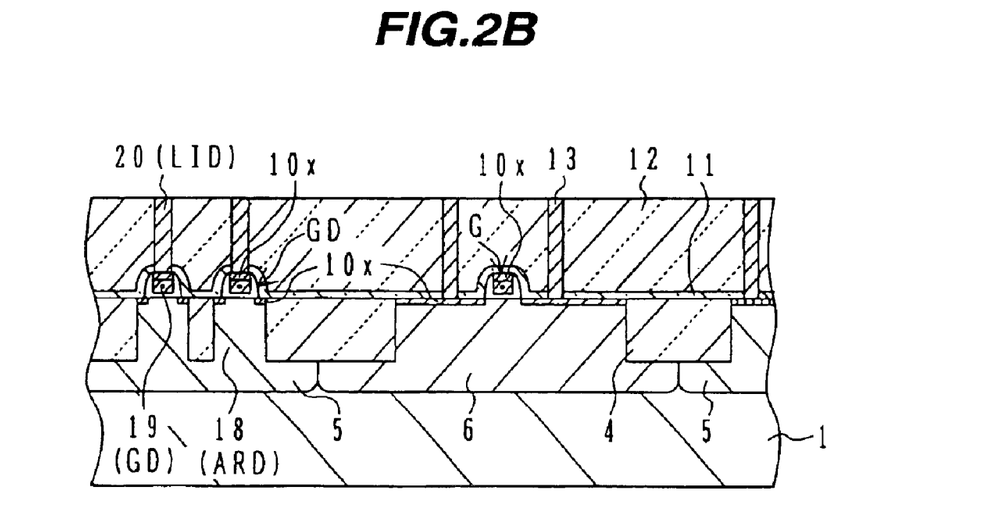

FIG. 2B shows a cross sectional structure taken along line IIB—IIB shown in FIG. 1. On the surface of a p-type silicon substrate 1, an isolation region 4 is formed by STI. In the surface layer of the silicon substrate 1, a p-type well 5 and an n-type well 6 are formed. Part of the n-type well 6 is exposed as the active region. An active region dummy 18 is disposed in the p-type well 5 by removing the isolation region 4.

A silicide layer 10x of cobalt silicide or the like is formed on the active region surface and gate electrode surface. A similar suicide layer 10x is formed also on the surface of the gate electrode dummy GD. In this example, although the silicide layer 10x is formed on the surface of the active region dummy 18, this silicide layer may not be formed by designing the gate electrode dummy wider.

An insulated gate electrode structure G is formed on the surface of the n-type well 6, and a gate electrode dummy GD is formed on the surface of the active region dummy 18. A silicon nitride layer 11 is formed on the substrate, covering the gate electrode G and gate electrode dummies GD. On this silicon nitride layer 11, an interlevel insulating film 12 of silicon oxide is formed.

Local interconnect grooves are formed through the interlevel insulating film 12, and local interconnects 13 are formed in these grooves. Similar grooves are formed above the active region dummies 18 and local interconnect dummies 20 are formed in these grooves.

As shown in FIG. 2B, although the local interconnect dummy 20 has as its underlying layers, the gate electrode dummy 19 and/or active region dummy 18, these dummy regions are maintained electrically separated or isolated. It is therefore possible to prevent a plurality of dummy regions along an in-plane direction from being connected and to avoid an unintended result. A method of manufacturing the structure shown in FIG. 2B will be described below.

Figure 3A:
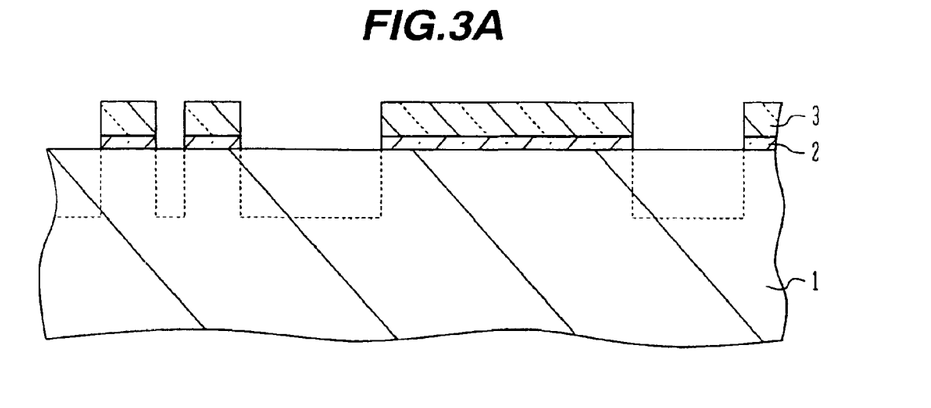
FIGS. 3A to 3I are cross sectional views illustrating main processes of a method of manufacturing the structure shown in FIG. 2B.

As shown in FIG. 3A, on the surface of a silicon substrate 1, a silicon oxide film 2 is grown to a thickness of about 10 nm through oxidation by hydrochloric acid at 900° C. On this silicon oxide film 2, a silicon nitride film 3 is grown to a thickness of about 110 nm by chemical vapor deposition (CVD).

A resist pattern is formed on the silicon nitride film 3 and the silicon nitride film 3 and silicon oxide film 2 are etched through anisotropic etching. The resist pattern is thereafter removed. By using the silicon nitride film 3 as a mask, the silicon substrate 1 is subjected to anisotropic etching. For example, a silicon substrate surface layer of about 300 nm thick is etched. A trench having a depth of 300 nm is therefore formed.

Figure 3B:
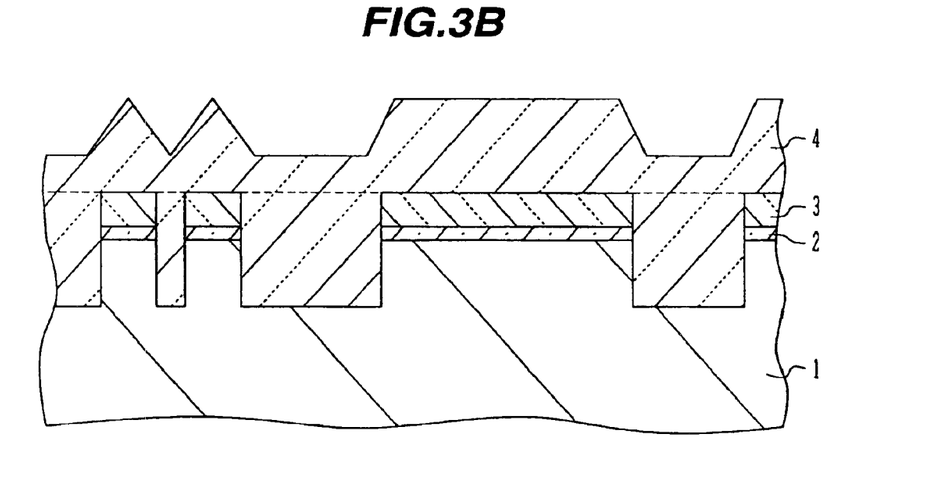

As shown in FIG. 3B, on the silicon substrate formed with trenches, a silicon oxide film 4 is grown to a thickness of about 500 nm by CVD. An unnecessary silicon oxide film 4 deposited on the silicon nitride film 3 is removed by chemical mechanical polishing (CMP). The silicon nitride film 3 functions as a CMP stopper. By forming active region dummies, the density of areas of the isolation region can be made uniform so that dishing and erosion can be suppressed.

Figure 3C:
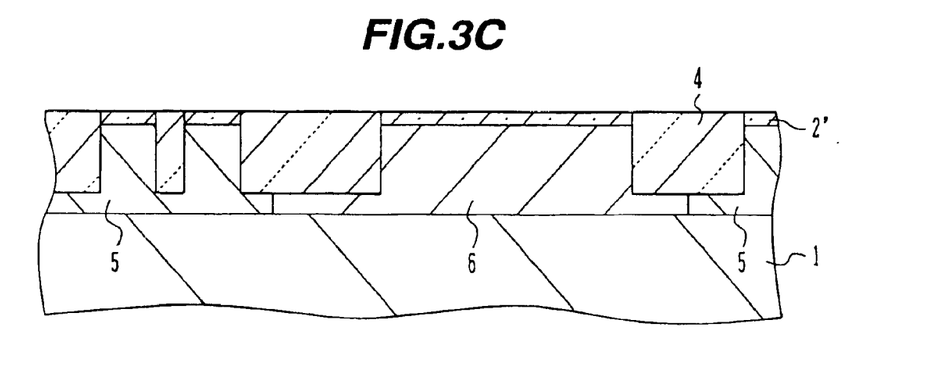

As shown in FIG. 3C, the silicon nitride film 3 is removed by hot phosphoric acid solution. The silicon oxide film 2 may be removed by hydrofluoric acid solution. In this case, a new silicon oxide film 2' is grown to a thickness of about 10 nm through oxidation by hydrochloric acid at 900° C. A resist mask separating the n- and p-channel regions is formed on the surface of the silicon substrate 1 and ion implantation for each of the n- and p-channel regions is performed to form wells.

For example, impurity ions are implanted at a dose of about $1\times10^{13}$ cm$^{-2}$. After an n-well 6 and a p-well 5 are formed, the silicon oxide film 2' used for ion implantation is removed.

Figure 3D:
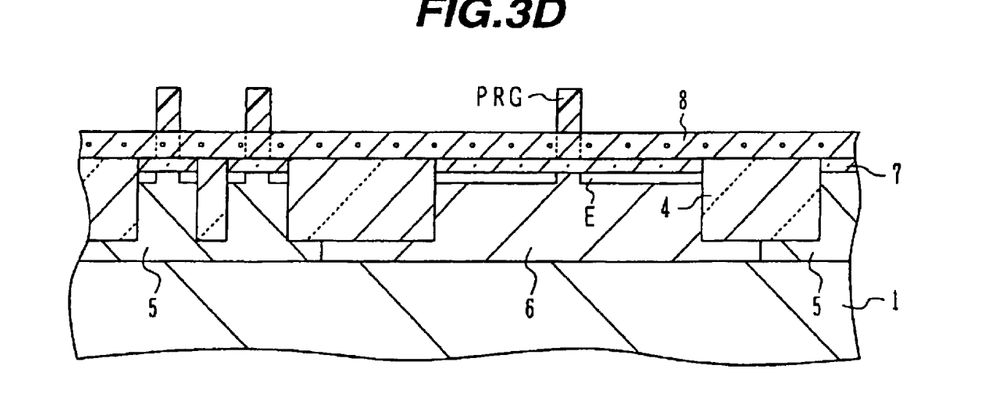

As shown in FIG. 3D, a gate oxide film 7 is grown to a thickness of about 1 nm on the exposed silicon surface by thermal oxidation. On this gate oxide film 7, a polysilicon layer 8 is formed to a thickness of about 110 nm by CVD. On the polysilicon layer 8, a resist pattern PRG for gate electrodes is formed. This pattern includes also the pattern for gate electrode dummies. By using the resist pattern PRG as a mask, the polysilicon layer 8 is etched. A gate electrode is formed above the active region. Gate electrode dummies are formed above the active region dummies.

If isolated gate electrodes and dense gate electrodes are mixed, the isolated gate electrode is likely to be etched excessively. By disposing gate electrode dummies, etching of gate electrodes can be made uniformly. Next, ion implantation is performed at a dose of, for example, about $1\times10^{14}$ cm$^{-2}$ for each of p- and n-channel regions to form shallow extension regions E.

Figure 3E:
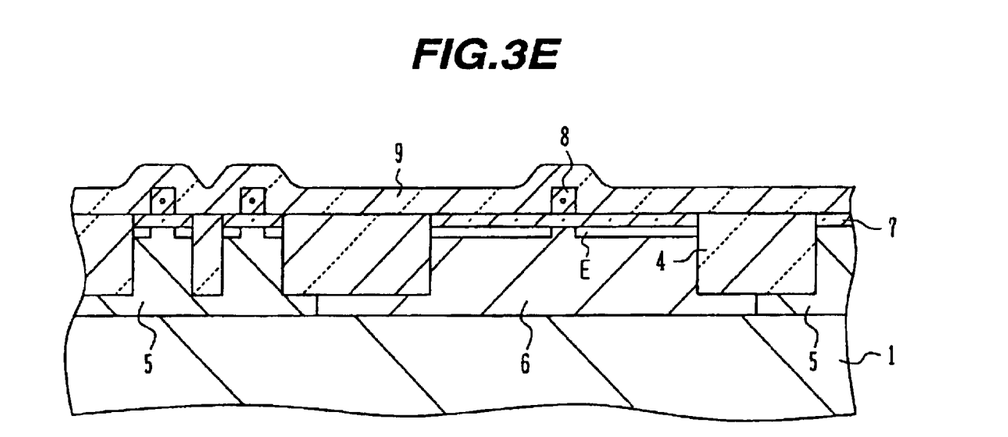

As shown in FIG. 3E, on the substrate surface, a silicon oxide layer 9 having a thickness of about 100 nm is formed by CVD. The silicon oxide film 9 is subjected to anisotropic etching to remove the silicon oxide film 9 on the flat surface. The silicon oxide film 9 is left on the side walls of the gate electrode 8 to form side wall spacers.

Figure 3F:
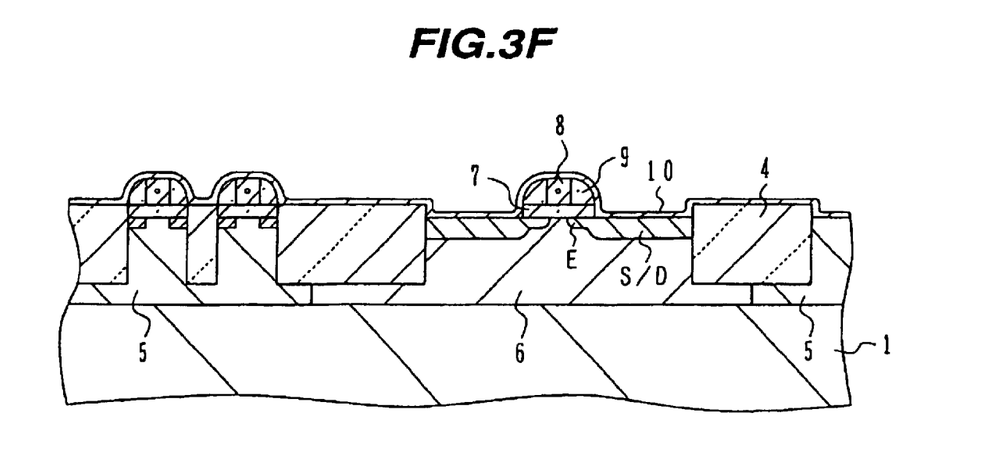

As shown in FIG. 3F, ion implantation is performed at a high impurity concentration, for example, at a dose of about $1\times10^{15}$ cm$^{-2}$ for each of p- and n-channel regions to form deep source/drain regions S/D having a high impurity concentration. After ion implantation, rapid thermal annealing (RTA) is performed at about 1050° C. to activate implanted ions.

Next, on the surface of the substrate 1, a cobalt film 10 having a thickness of, for example, 5 nm is formed by sputtering. Annealing at about 520° C. is performed to form cobalt suicide on the surfaces of the gate electrodes and on the exposed surfaces of the source/drain regions S/D. Unreacted metal film is removed, and further annealing is carried out according to necessity.

Figure 3G:
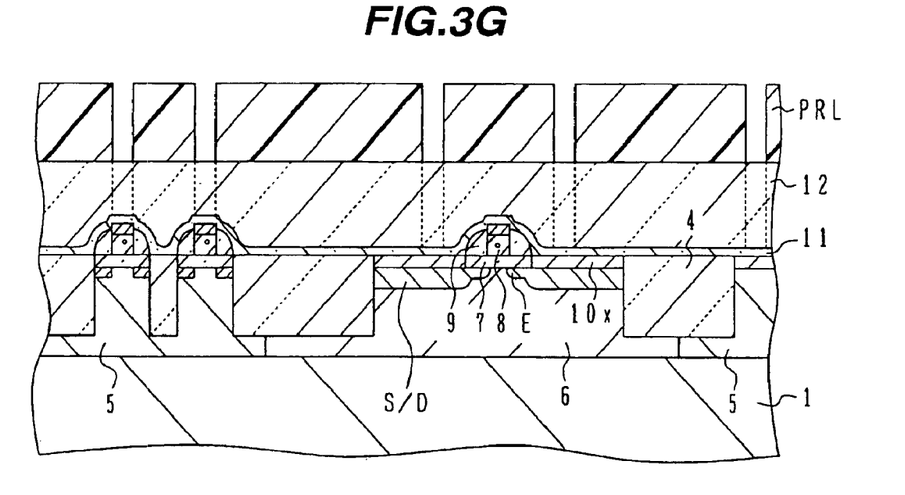

As shown in FIG. 3G, after the cobalt silicide layer 10x is formed, a silicon nitride film 11 is deposited to a thickness of about 40 nm by CVD. On the silicon nitride film 11, a silicon oxide film 12 is formed having a thickness of about 650 nm. The surface of the silicon oxide film 12 is planarized by CMP. A photoresist pattern PRL is formed on the planarized surface and a local interconnect pattern and a local interconnect dummy pattern are formed through anisotropic etching. After this etching, the photoresist pattern PRL is removed.

Figure 3H:
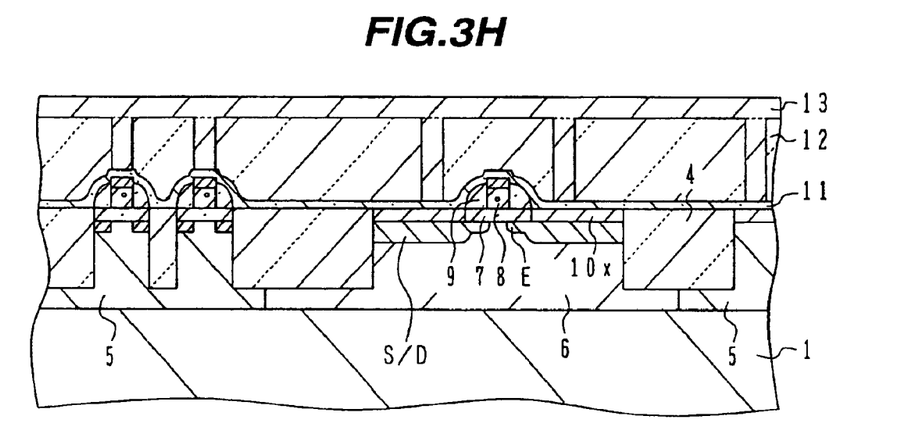

As shown in FIG. 3H, on the surface of the substrate formed with local interconnect grooves, a titanium film and a titanium nitride film each having a thickness of about 10 nm are formed by CVD. A tungsten film having a thickness of about 200 nm is formed on the titanium nitride film by CVD. A local interconnect made of a laminated metal layer 13 is buried or embedded in each local interconnect groove. An unnecessary metal layer deposited on the silicon oxide film 12 is removed by CMP. Since both the local interconnects and local interconnect dummies are formed, a flat surface can be reliably formed by CMP.

Figure 3I:
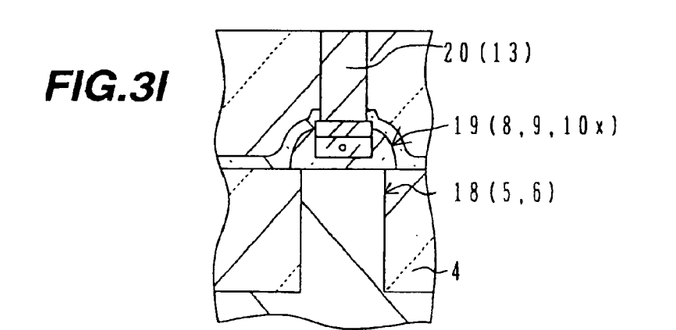

FIG. 3I is a schematic cross sectional view showing the structure of the dummy region formed in the manner described above. An active region dummy 18 is formed by partially removing the isolation region 4. A gate electrode dummy 19 is formed above the active region dummy, and a local interconnect dummy 20 is formed on the gate electrode dummy 19. Side wall spacers 9 are formed on the side walls of the gate electrode dummy. Since the side wall spacers 9 are made of electrically insulating material, the side wall spacers will not form electric connection. The state that the region of the conductive gate electrode is disposed inside the active region dummy, is expressed that the gate electrode dummy is inside the active region dummy.

In the embodiment described above, a laminated dummy structure is made of a lamination of the active region dummy, gate electrode dummy and local interconnect dummy. The laminated dummy structures are formed in such a manner that they will not form an electric shortage between wells and they are independent from each other. The laminated dummy structure is not limited only to that described above. It is not necessarily required to form both the active region dummy and gate electrode dummy.

Figure 4A:
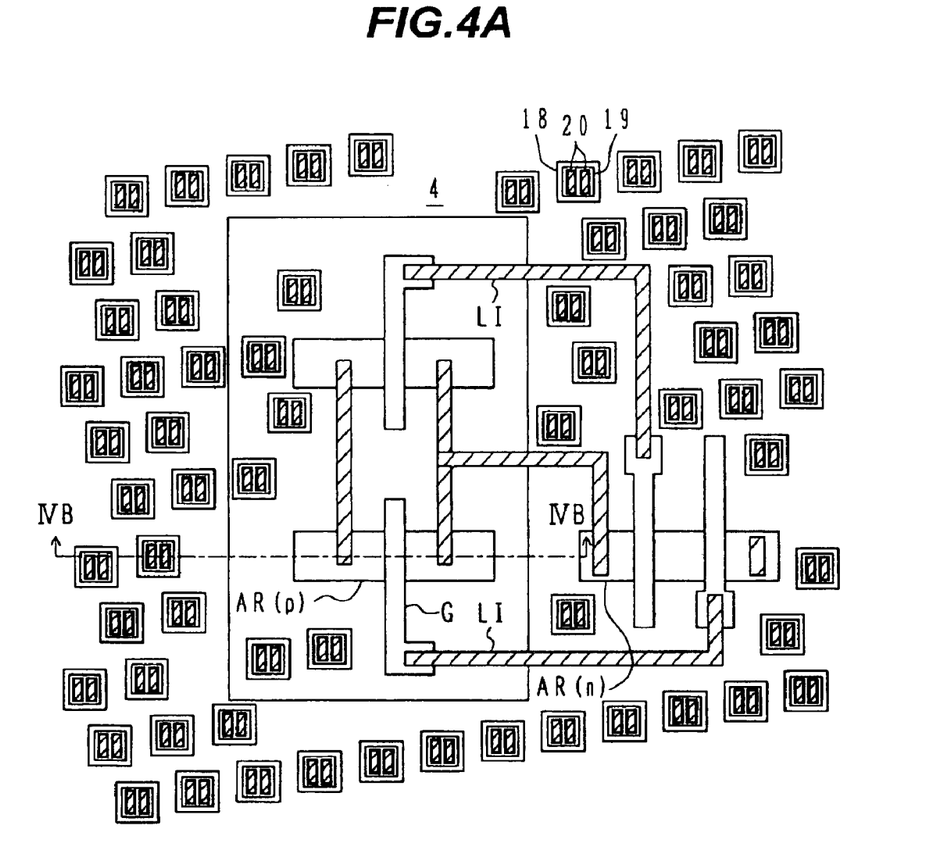
FIGS. 4A and 4B are a plan view and a cross sectional view showing a modification of the embodiment shown in FIG. 1.
Figure 4B:
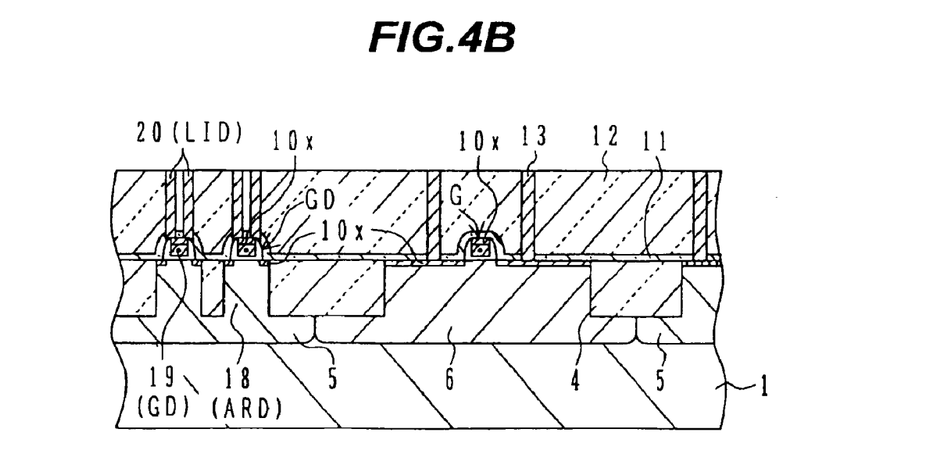

FIGS. 4A and 4B show a modification of the embodiment described above. In the structure shown in FIG. 1, one gate electrode dummy is formed on one active region dummy, and one local interconnect dummy is formed on the gate electrode dummy.

In the structure shown in FIGS. 4A and 4B, one gate electrode dummy 19 is formed on one active region dummy 18, and two local interconnect dummies 20 are formed on the gate electrode dummy. Although two local interconnect dummies 20 may be electrically connected by the lower level dummy, two lower level dummies are not electrically connected.

Figure 5A:
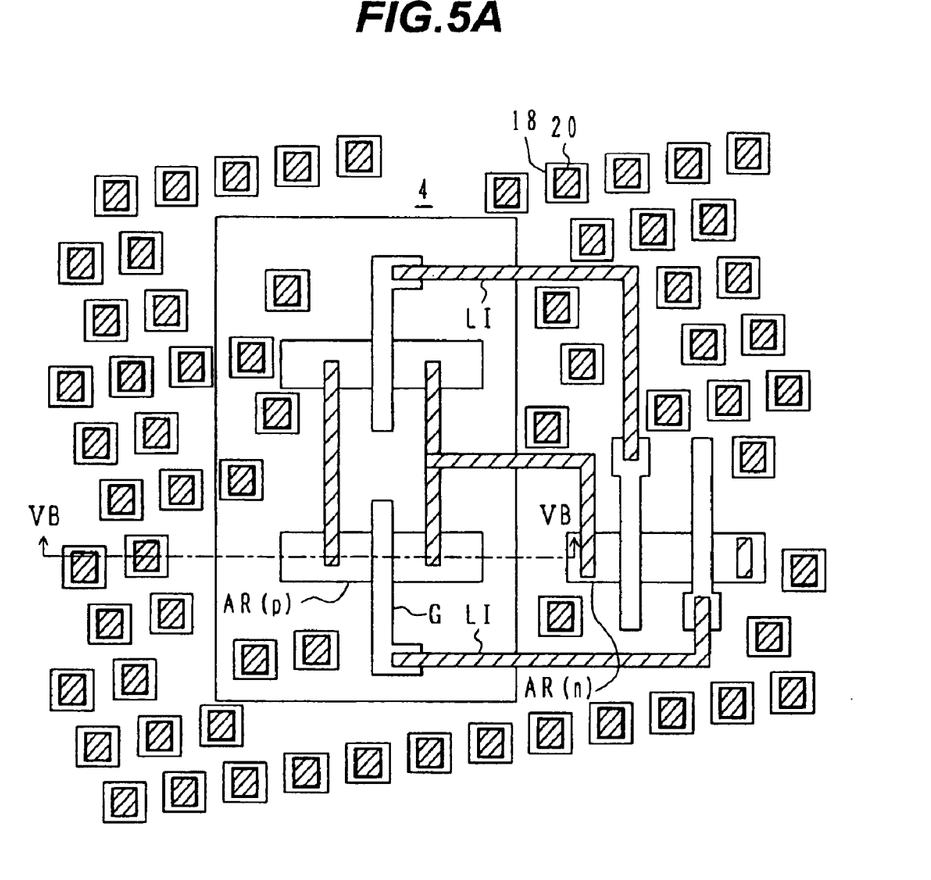
FIGS. 5A and 5B are a plan view and a cross sectional view showing the structure of a semiconductor device according to another embodiment of the invention.
Figure 5B:
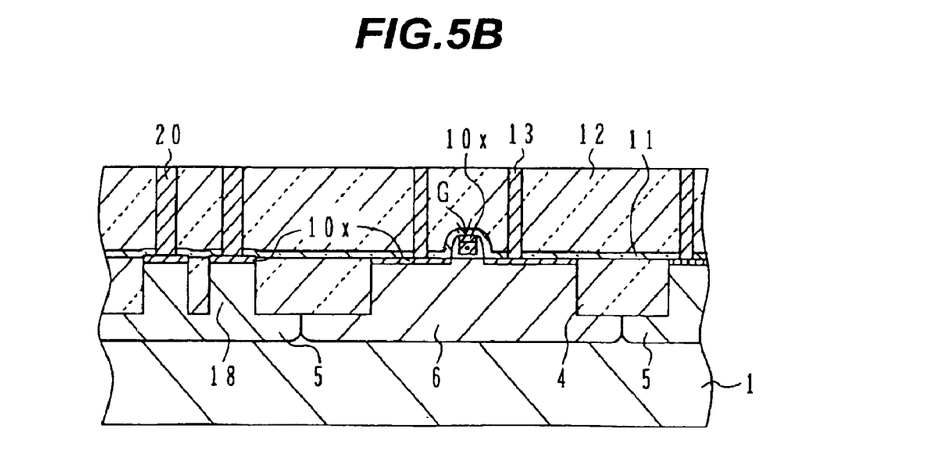

FIGS. 5A and 5B show the structure that a gate electrode dummy is not formed, and a local interconnect dummy is formed on an active region dummy. The active region dummies 18 are formed separately in an n-type well NW and a p-type well. A silicide layer 10x may be formed on the surface of the active region dummy 18. The local interconnect dummy 20 is formed inside the active region dummy 18. Therefore, the local interconnect dummy 20 will not electrically connect two active region dummies 18.

Figure 6A:
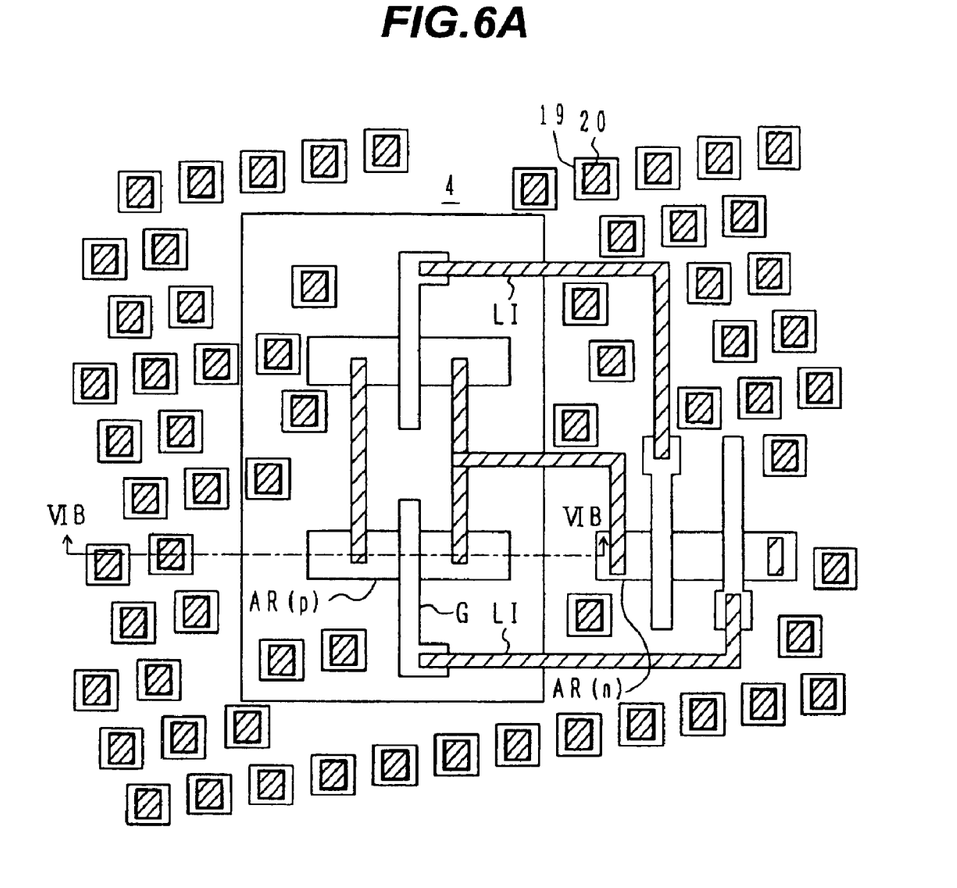
FIGS. 6A and 6B are a plan view and a cross sectional view showing the structure of a semiconductor device according to still another embodiment of the invention.
Figure 6B:
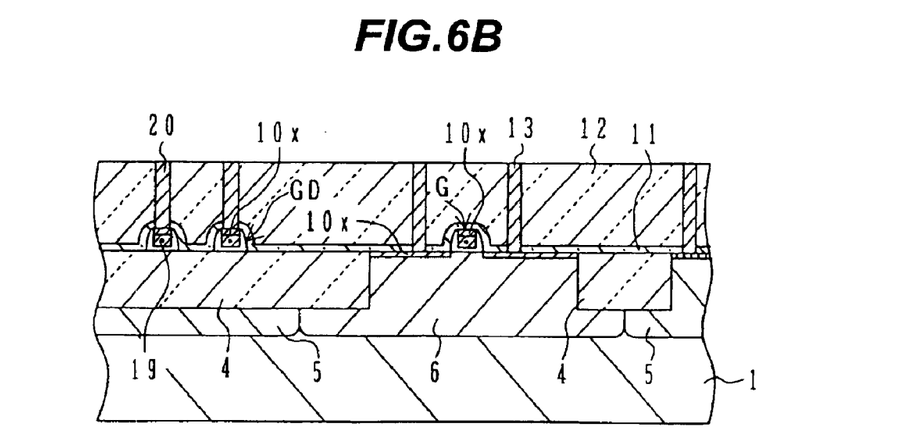

FIGS. 6A and 6B show the structure that an active region dummy is not formed, and a local interconnect dummy is formed on a gate electrode dummy. The local interconnect dummy 20 is formed on the gate electrode dummy 19 formed on the isolation region 4. The local interconnect dummy 20 is disposed in such a manner that it will not electrically connect two gate electrode dummies.

In the embodiment described above, each dummy region is made of a laminated structure, and the upper level dummy is disposed in such a manner that it will not electrically connect two or more lower level dummies. Dummy regions along with parasitic capacitances are therefore made uniform. In FIGS. 1, 4A, 5A, and 6A, local interconnects are distributed along a vertical direction and in a lateral direction (reference direction) of the drawing. As shown in the drawings, by disposing dummy regions obliquely relative to the reference layout direction of a circuit layout, parasitic capacitances of local interconnects can be made uniform and electric shortage can be avoided.

The present invention has been described in connection with the preferred embodiments. The invention is not limited only to the above embodiments. It will be apparent to those skilled in the art that other various modifications, improvements, combinations, and the like can be made.

What we claim is:

1. A semiconductor device comprising:
   a semiconductor substrate;
   an isolation region formed in a surface layer of said semiconductor substrate and defining a plurality of active regions;
   at least one gate electrode formed above a substrate surface in each active region, constituting a semiconductor element in the active region;
   an interlevel insulating film formed over said semiconductor substrate, covering said gate electrode;
   a plurality of local interconnects formed through said interlevel insulating film and electrically connected to a region of the semiconductor element;
   a plurality of local interconnect dummies formed through said interlevel insulating film and electrically separated from said local interconnect; and
   a plurality of lower level dummies each including one of an active region dummy formed through said isolation region, a laminated dummy of an active region dummy formed through said isolation region and a gate electrode dummy formed over said active region dummy and a gate electrode dummy formed above said isolation region,
   wherein each of said local interconnect dummies is disposed so that said local interconnect dummy is not connected to two lower level dummies.

2. A semiconductor device according to claim 1, wherein a width of said local interconnect dummy is in a range from a same width as a width of said local interconnect to twice the width of said local interconnect.

3. A semiconductor device according to claim 2, wherein said lower level dummy is the active region dummy.

4. A semiconductor device according to claim 3, wherein said semiconductor substrate has a p-well and an n-well, the active region includes silicide layers formed over both sides of said gate electrode, and the active region dummy does not lie across a boundary between the p-well and the n-well.

5. A semiconductor device according to claim 3, wherein said local interconnect dummy is disposed only inside an upper surface of said active region dummy.

6. A semiconductor device according to claim 2, wherein said lower level dummy is the gate electrode dummy formed over said isolation region.

7. A semiconductor device according to claim 6, wherein said local interconnect dummy is formed only over an upper surface of said gate electrode dummy.

8. A semiconductor device according to claim 2, wherein said lower level dummy is the laminated dummy and said local interconnect dummy is not connected to two or more laminated dummies.

9. A semiconductor device according to claim 8, wherein the gate electrode dummy of the laminated dummy does not extend on two or more active region dummies.

10. A semiconductor device according to claim 1, wherein said lower level dummies are disposed obliquely relative to a reference layout direction of said semiconductor elements.

* * * * *